United States Patent [19]

Hudspeth et al.

[11] 4,138,648

[45] Feb. 6, 1979

[54] BALANCED SYNCHRONOUS PARAMETRIC AMPLIFIER

[75] Inventors: Thomas Hudspeth, Malibu; Harmon H. Keeling, Kernville, both of Calif.

[73] Assignee: Hughes Aircraft Company, Culver City, Calif.

[21] Appl. No.: 892,532

[22] Filed: Apr. 3, 1978

[51] Int. Cl.² .............................................. H03F 7/00
[52] U.S. Cl. ........................................ 330/4.9; 330/56
[58] Field of Search ............................................ 330/4.9

[56] References Cited

U.S. PATENT DOCUMENTS 3,992,675   11/1976   Niehenke et al. ..................... 330/4.9

*Primary Examiner*—Rudolph V. Rolinec
*Assistant Examiner*—Darwin R. Hostetter
*Attorney, Agent, or Firm*—John Holtrichter, Jr.; W. H. MacAllister

[57] ABSTRACT

A wideband synchronously pumped parametric amplifier is described that features minimum time delay along with wide bandwidth, a low noise figure and cost for advantageous use in receivers designed to receive television signals from a satellite through a relatively small antenna, the amplifier obtaining maximum bandwidth by the use of two diodes in parallel and two double-tuned circuits, where the diode capacities are large enough to swamp parasitic and coupling capacitances.

7 Claims, 4 Drawing Figures

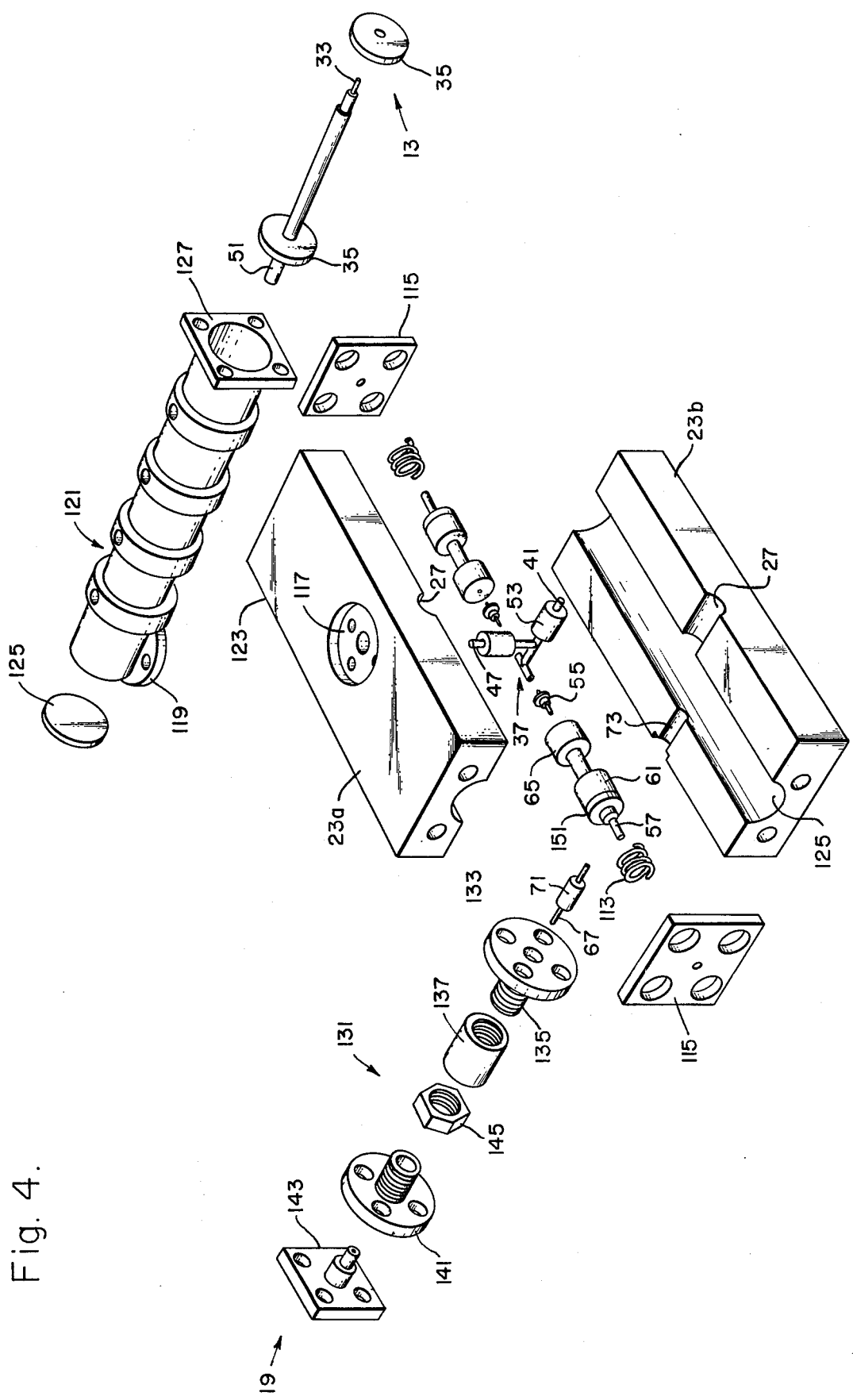

BALANCED SYNCHRONOUS PARAMETRIC AMPLIFIER

BACKGROUND OF THE INVENTION

The background of the invention will be set forth in two parts.

1. Field of the Invention

This invention relates to parametric amplifiers and more particularly to balanced synchronous parametric amplifiers.

2. Description of the Prior Art

In recent years there has been a growing interest in what are known as small earth terminals for satellite communications systems. The heart of such terminals is a phase-locked parametric receiver which receives, for example, television signals from a satellite through a relatively small antenna. Such a receiver must have wide bandwidth characteristic with a minimum of time delay. Wide bandwidth is required for reception of high deviation full bandwidth television signals for which the system is designed.

The phase-locked parametric receiver incorporates a phase control loop which is closed through a parametric amplifier. It is essential for stable operation that the loop time delay be minimized and thus, in particular, that time delay in the parametric amplifier be held as small as possible.

While phase-locked receivers using a synchronously-pumped parametric amplifier are known in the art, such receivers have not been used for wideband signals because of the difficulty of achieving sufficiently small loop delays for stable operation. It should, therefore, be evident that a new technique which provides wide bandwidth and minimum time delay in a parametric amplifier would constitute a significant advancement of the art.

SUMMARY OF THE INVENTION

In view of the foregoing factors and conditions characteristic of the prior art, it is a primary object of the present invention to provide an improved balanced synchronous parametric amplifier.

Another object of the present invention is to provide a balanced synchronous parametric amplifier suitable for use in a phase-locked synchronous parametric receiver for receiving television signals from a satellite through a relatively small antenna.

Still another object of the present invention is to provide a low cost balanced synchronous parametric amplifier exhibiting broad bandwidth and short delay time.

In accordance with the present invention, a balanced synchronous parametric amplifier includes signal port means for receiving and transmitting signal frequency energy and pump port means for receiving pump frequency energy. Also included is a diode circuit including a pair of serially connected biased diodes exhibiting nonlinear capacitance characteristics and varying in the same direction when subjected to pump frequency energy. A double tuned signal frequency resonant circuit is tuned to the signal frequency energy and is coupled to the signal port means, while a double tuned pump frequency resonant circuit is tuned to the pump frequency energy and is coupled to the pump port means. The diode circuit is shared by both of the double tuned resonant circuits, and the diodes are effectively in parallel in the double tuned signal frequency resonant circuit and in series in the double tuned pump frequency resonant circuit.

The features of the present invention which are believed to be novel are set forth with particularity in the appended claims. The present invention, both as to its organization and manner of operation, together with further objects and advantages thereof, may best be understood by making reference to the following description taken in conjunction with the accompanying drawings in which like reference characters refer to like elements in the several views.

BRIEF DESCRIPTION OF THE DRAWINGS

FIG. 4 is an exploded view of the balanced synchronous parametric amplifier constructed in accordance with the present invention.

DESCRIPTION OF THE PREFERRED EMBODIMENTS

Figure 1:
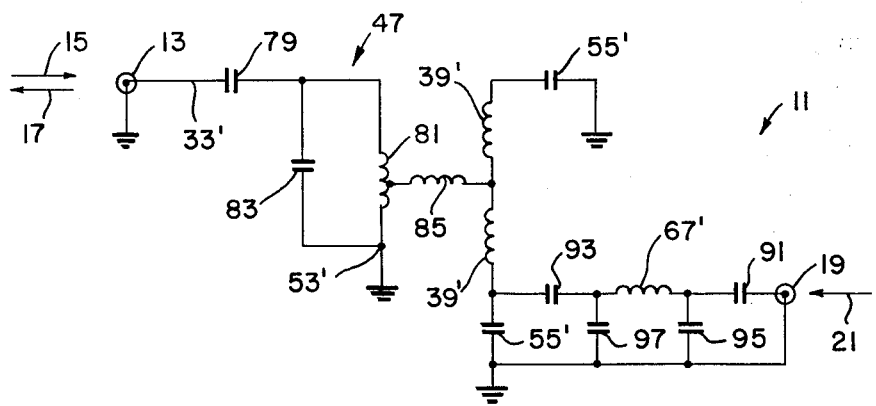
FIG. 1 is a schematic diagram of an equivalent circuit of the parametric amplifier according to the invention.
Figure 2:
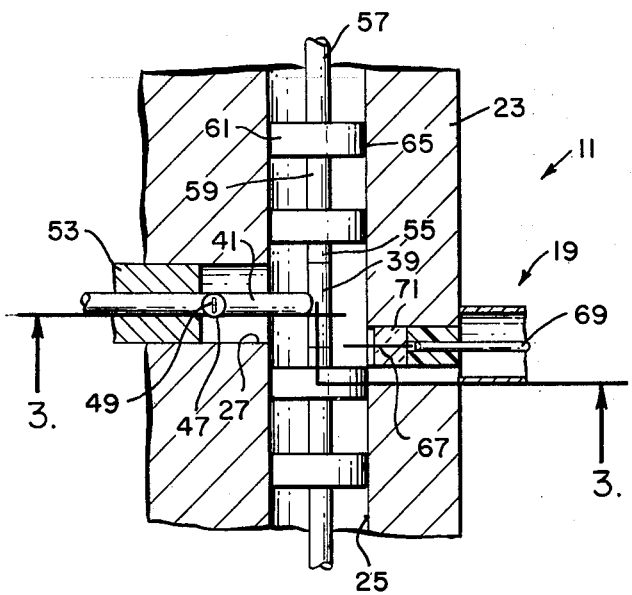
FIG. 2 is a plan view of a portion of the parametric amplifier presented schematically in FIG. 1, showing the pump frequency and double tuned circuits.
Figure 3:
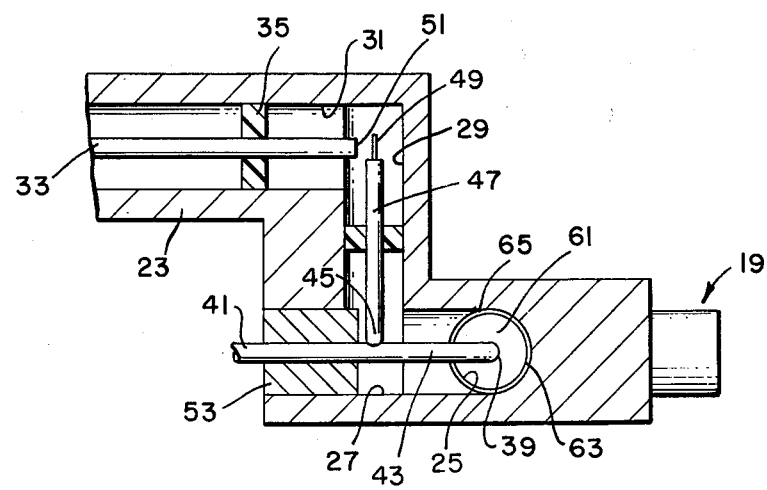
FIG. 3 is a sectional elevational view, taken along line 3—3, of a portion of the parametric amplifier, showing the signal frequency and double tuned circuits.

Referring now to the drawings and more particularly to FIGS. 1–3, there is shown a balanced synchronous parametric amplifier 11 including a signal port 13 for receiving input signal frequency energy 15 and for transmitting amplified signal frequency energy 17, and a pump port 19 for receiving pump frequency energy 21.

In this embodiment, a housing 23 is provided with a first horizontal cylindrical bore 25, a second horizontal cylindrical bore 27 orthogonal to and intersecting the first bore 25, and a vertical bore 29 orthogonal to and intersecting the second horizontal bore 27 a predetermined distance from the first horizontal bore 25. Communicating with the signal port 13 and the top of the first horizontal bore 25 is a third horizontal bore 31 carrying a coaxial center conductor 33 supported by an insulative sleeve 35.

Disposed within the first horizontal bore 25 is a T-section conductor 37 having relatively short oppositely extending arm portions 39 coaxial within the bore 25, and an elongated stem portion 41 extending coaxially with respect to the second horizontal bore 27. Conductively attached at an intermediate spot 43 along the stem portion 41 is the lower end 45 of a vertical center conductor 47 coaxially positioned in the vertical bore 29. The conductor 47 includes an upper tab portion 49 having its broad planar surface spaced from an inner end 51 of the conductor 33. Capacitive coupling between the tab portion 49 and the end 51 of the signal line conductor 33 may be varied in several ways such as axially moving the center conductor 33 and/or by bending the tab portion 49, for example. Inductive tuning of the stem portion 41 is provided by a coaxially disposed conductive sleeve 53 slidably disposed in the second horizontal bore 27, as shown in FIGS. 2 and 3.

Attached to the ends of the arms 39 of the T-section 37 are a pair of diodes 55 poled serially and which exhibit non linear capacitance characteristics when biased by backward biased potential sources (not shown) connected to the outer ends 57 of axially aligned center conductors 59 coaxially disposed in the first horizontal bore 25 and when subjected to pump frequency energy. The conductors 59 each carry conductive disc portions 61 having outer peripheral surfaces 63 slightly spaced from the inner wall of the bore 25. The disc portions 61 are insulated from the housing 23 by conventional insulative tape 65 wrapped about the surfaces 63. The disc portions 61 on each side of the diodes 55 act as RF bypass capacitances to prevent RF energy from leaving the housing 23 via the diode bias voltage leads.

Pump frequency energy, introduced at the pump port 19, is capacitively coupled first to an outer end of a wire resonator 67 from a port center conductor 69, and then capacitively coupled from the inner end of the wire resonator 67 to a point adjacent the junction of an outer end of one of the arm portions 39 and an associated diode 55, as best viewed in FIG. 2. The wire resonator is approximately $\frac{1}{4}\lambda$ at the frequency of the pump energy and is insulatively coaxially supported by a sleeve 71 within a horizontal pump bore 73 that communicates with the first horizontal bore 25 and the pump port 19. The port center conductor 69 is insulatively supported by an insulative sleeve 75, and is provided with a cupped inner end 77 into which the outer end of the wire resonator 67 may extend without making contact.

Referring now more particularly to the RF equivalent circuit diagram of FIG. 1, input signal energy 15 entering the signal port 13 moves along conductor 33' and is capacitively coupled to the vertical conductor 47 by effective capacitor 79 which is provided by the gap or spacing between the end 51 of the conductor 33 and the tab portion 49 of the vertical conductor 47. RF energy, at this point, sees the vertical conductor 47 as a signal frequency input resonator 81 that is grounded at its opposite end by the adjustable shorting sleeve 53 (53') contacting the stem portion 41. The inductor is shunted by an effective capacitance 83 relating to the distributive capacitance of the coaxial line, that is, the spacial relationship between the outer surface of the conductor 47 and the inner surface of the vertical bore 29.

The length of the stem portion 43 between the junction of the stem portion with the vertical conductor 47 and junction of the arm portions 39 acts as a signal frequency second resonator line 85, while the arm portions each act as parallel inductors 39', the ends of which are serially terminated to ground through the nonlinear capacitances 55' of the diodes 55.

As noted previously, pump energy 21 is first coupled from the center conductor 69 to the wire resonator 67 and then from the resonator 67' to the junction of one arm 39 and a diode 55. These capacitances are schematically represented in FIG. 1 by capacitors 91 and 93, respectively. Like effective capacitor 83, capacitors 95 and 97 on each side of the pump resonator 67', can be considered the distributed capacitance of the pump coaxial line.

It can thus be seen that both the signal port 13 and the pump port 19 are coupled into the diode array by way of double tuned bandpass filter circuits, the diode capacities being incorporated into a resonator in each case. The resonators are synchronously tuned, and the coupling between the resonators and input resonators loaded Q are adjusted to produce a nearly constant conductance and zero susceptance across the diode junctions, including their own capacities, over the bandwidth of the amplifier. The resulting response, like that of a Butterworth or Chebyschev-type filter, prevents the bandwidth from shrinking so much with increasing gain, as occurs with single-tuned type circuits.

The capacities of the diodes 55 are chosen relatively large, and coaxial line inductive element impedances are preferably relatively high to keep the diode resonating line lengths shorter than an eigth wavelength. This prevents dilution of the junction capacity by circuit capacity shunting it. A relatively high junction-to-case capacity ratio in the diodes 55 decreases dilution from the case capacity, while sufficient junction capacity is used to make the diode pump frequency resonator very short.

The wire resonator 67 in the pump arm has a high impedance, so a very small capacitance is needed to couple it to the diode resonator. The effective coupling capacitor 93 is so small that it has negligible unbalancing effect, nor does it dilute the junction capacitance noticeably.

Referring now to FIG. 4, there is shown an embodiment of the invention described and illustrated in FIGS. 2 and 3, and identified by reference numeral 111. As can be seen, the housing is fabricated in two parts, 23A and 23B, and includes compression springs 113, end plates 115, and a disc-shaped depression 117 configured to accept a flange 119 of the signal arm 121 provided on the upper surface 123 of the upper housing section 23A. An end plate 125 is also provided for the signal arm 121, which arm further includes a signal port flange 127.

The pump arm 131, which includes the wire resonator 67, also includes a housing attachment flange 133 having a threaded, axially-extending tube 135 which is threadably engaged with a pump arm sleeve 137, the latter also threadably engaging a tube portion 139 of a pump port flange 141 to which is attached a pump port connector 143. The spacial relationship between the flanges 133 and 141 may be readily adjusted by rotating the sleeve 137 relative to the flanges and, once the adjustment is completed, the sleeve 137 is prevented from further rotating by movement of a lock nut 145 against the sleeve 137.

The springs 113 are mounted about the end portions 57 of the center conductors 59 but are electrically insulated from the outermost disc portions 61 by an insulative member 151. The springs force the center conductors 59 and the diodes 55 toward the T-section conductor 37 in order to hold the diode assembly in place within the first horizontal bore 25. The holes 153 centrally located in the housing end plates 115 are adapted to accept the axially extending tubular portions of the insulative members 151 so that the end portions 57 will not contact and be shorted by the housing. A conventional bias voltage supply is then easily attached to the end portions 57 which extend beyond the plates 115.

In testing the amplifier constructed in accordance with the invention as shown in FIG. 4, a noise figure measurement of 0.6 dB was obtained in the 4 GHz region. This included a 0.1 dB circulator loss connected to the signal port 13. The 3 dB bandwidth at 25 dB gain was about 60 MHz. With 15 dB gain, the bandwidth was about 120 MHz. Delay time at 15-dB gain was found to be approximately 5 nanoseconds.

From the foregoing it should be evident that there has herein been described a new and improved balanced synchronous parametric amplifier that exhibits low noise, short time delay over a broad bandwidth.

Although specific embodiments of the invention have been described in detail, it should be understood that other enbodiments and modifications which are obvious

What is claimed is:

1. A balanced synchronous parametric amplifier, comprising:
    signal port means for receiving and transmitting signal frequency energy;
    pump port means for receiving pump frequency energy;
    a diode circuit including a pair of serially connected biased diodes exhibiting nonlinear capacitance characteristics and varying in the same direction when subjected to said pump frequency energy;
    a double tuned signal frequency resonant circuit tuned to said signal frequency energy and coupled to said signal port means;
    a double tuned pump frequency resonant circuit tuned to said pump frequency energy and coupled to said pump port means, said diode circuit being shared by both of the double tuned resonant circuits, said diodes being effectively in parallel in said double tuned signal frequency resonant circuit and in series in said double tuned pump frequency resonant circuit.

2. The balanced synchronous parametric amplifier according to claim 1, wherein said pump port means includes a capacitive coupling probe spaced adjacent to one of said diodes.

3. The balanced synchronous parametric amplifier according to claim 2, wherein said coupling probe is an end portion of a resonant wire circuit, said resonant wire circuit being capacitively coupled to said pump frequency energy.

4. The balanced synchronous parametric amplifier according to claim 1, wherein said pump port means includes pump adjustment means for tuning said double tuned pump frequency resonant circuit.

5. The balanced synchronous parametric amplifier according to claim 1, wherein said signal port means includes a coaxial waveguide structure having a central conductor, the inner end of said central conductor being spaced from a portion of said double tuned signal frequency resonant circuit, said spacing effectively providing capacitive coupling of said signal frequency energy to said double tuned signal frequency resonant circuit.

6. The balanced synchronous parametric amplifier according to claim 1, wherein a first tuned portion of said double tuned signal frequency resonant circuit is inductively coupled to a second tuned portion of said double tuned signal frequency resonant circuit.

7. The balanced synchronous parametric amplifier according to claim 1, wherein said double tuned signal frequency resonant circuit includes a coaxial central conductor disposed in a coaxial waveguide section, and includes a slidable shorting member shorting said central conductor in said coaxial waveguide section.

* * * * *